United States Patent [19]

Itoh

[11] Patent Number: 5,134,318
[45] Date of Patent: Jul. 28, 1992

[54] ADJUSTABLE ANALOG FILTER CIRCUIT WITH TEMPERATURE COMPENSATION

[75] Inventor: Hiroya Itoh, Yokohama, Japan

[73] Assignee: Kabushiki Kaisha Toshiba, Kawasaki, Japan

[21] Appl. No.: 565,986

[22] Filed: Aug. 13, 1990

[30] Foreign Application Priority Data

Aug. 16, 1989 [JP] Japan ................................ 1-210843

[51] Int. Cl.$^5$ .......................... H03K 5/00; G06G 7/10
[52] U.S. Cl. .................... 307/521; 307/556; 307/491; 307/310; 328/167
[58] Field of Search ............... 307/521, 556, 271, 310, 307/591, 491; 328/167

[56] References Cited

U.S. PATENT DOCUMENTS

| | | | |
|---|---|---|---|
| 4,699,520 | 10/1987 | Wallenfang | 307/310 |
| 4,716,315 | 12/1987 | Bell | 307/591 |
| 4,818,903 | 4/1989 | Kawano | 307/526 |
| 4,851,719 | 7/1989 | Hitomi | 307/521 |
| 4,883,992 | 11/1989 | Koglin et al. | 307/491 |
| 4,888,502 | 12/1989 | Jarrett | 307/521 |

Primary Examiner—Edward P. Westin
Assistant Examiner—Richard Roseen
Attorney, Agent, or Firm—Banner, Birch, McKie & Beckett

[57] ABSTRACT

An analog voltage is input to a filter circuit. A time constant in the filter circuit is adjusted by a variable resistor arranged in a filter adjusting circuit. In addition, a time constant error in the filter circuit caused by a change in temperature can be compensated in accordance with a current value supplied from a filter compensation circuit. In the above-described filter compensation circuit, a potential difference proportional to an absolute temperature is generated, and a current value supplied to the filter circuit from the filter adjustment circuit is changed in accordance with the potential difference.

11 Claims, 4 Drawing Sheets

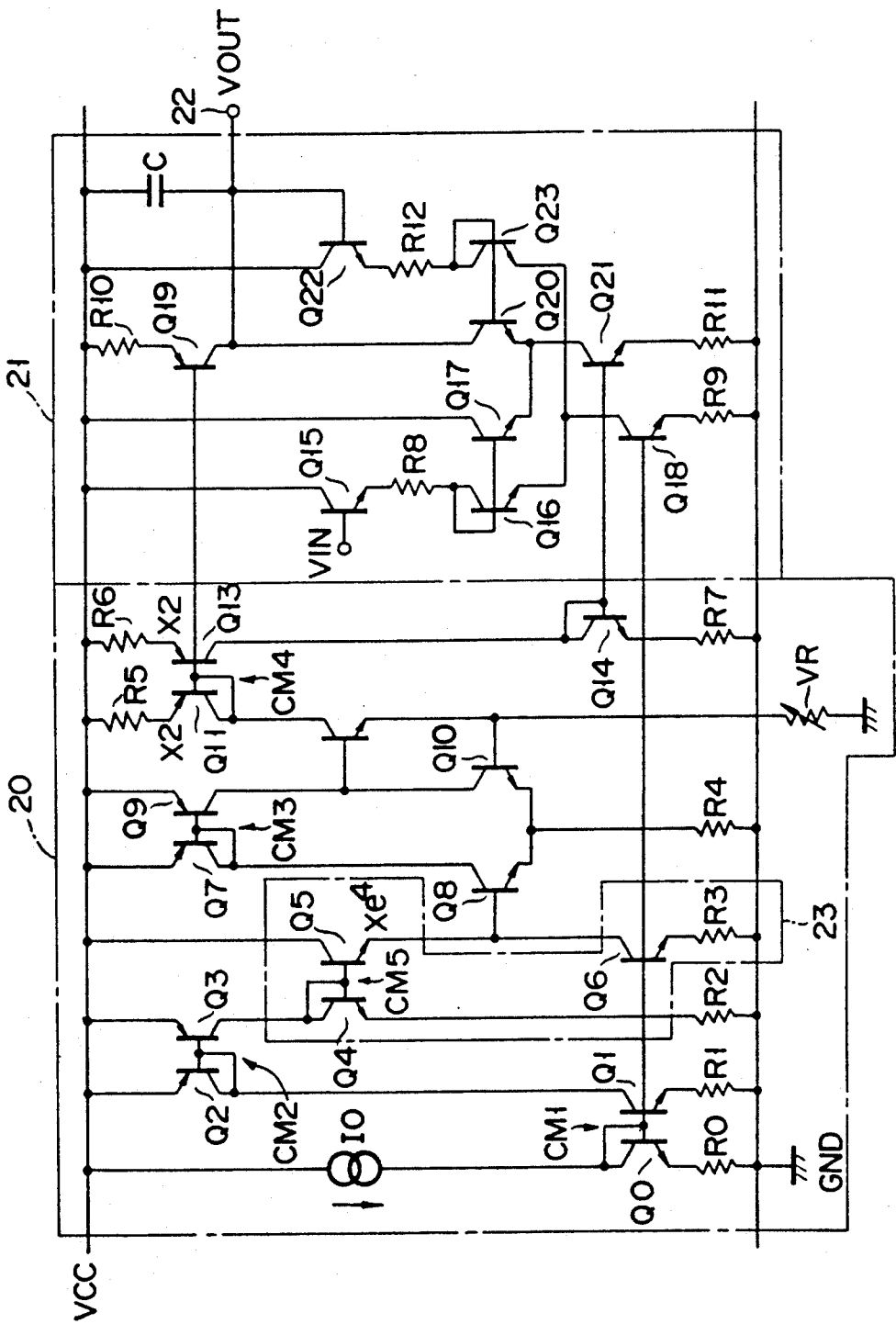
F I G. 2

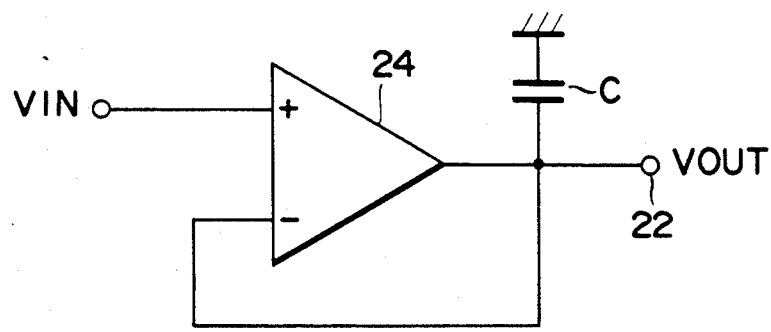
F I G. 3
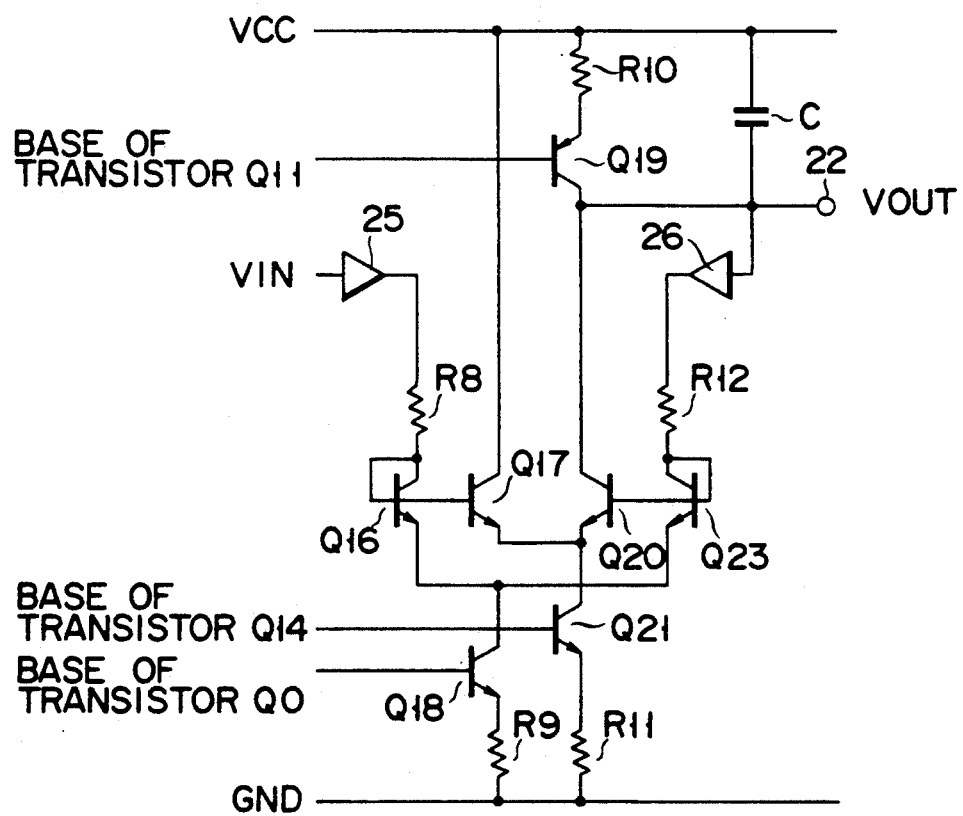
F I G. 4

ADJUSTABLE ANALOG FILTER CIRCUIT WITH TEMPERATURE COMPENSATION

BACKGROUND OF THE INVENTION

1. Field of the Invention

The present invention relates to an analog filter circuit incorporated in a semiconductor integrated circuit and, more particularly, to an improvement of a filter adjusting circuit.

2. Description of the Related Art

FIG. 1 shows a conventional analog filter circuit. In FIG. 1, reference numeral 20 denotes a filter adjusting circuit; and 21, a filter circuit.

The filter circuit 21 is constituted by amplifying npn transistors Q15 and Q22, the collectors of which are connected to a VCC potential, npn transistors Q16 and Q23, the emitters of which are commonly connected and collectors and bases are connected to each other, a resistor R8 connected between the emitter of the transistor Q15 and the collector of the transistor Q16, a resistor R12 connected between the emitter of the transistor Q22 and the collector of the transistor Q23, an npn transistor Q18 for current source and a resistor R9 connected in series between a common emitter connecting point of the transistors Q16 and Q23 and a ground potential GND, an npn transistor Q17, the base of which is connected to the base of the transistor Q16, and the collector of which is connected to the VCC potential, an npn transistor Q20, the emitter of which is connected to the emitter of the transistor Q17 and the base of which is connected to the base of the transistor Q23, a resistor R10 and a pnp transistor Q19 connected in series between the VCC potential and the collector of the transistor Q20, a capacitor C connected between the collector of the transistor Q19 (a signal output node 22) and the VCC potential, and an npn transistor Q21 for current source and a resistor R11 connected in series between a common emitter connecting point of the transistors Q17 and Q20 and the ground potential GND.

An analog input voltage VIN is applied to the base of the amplifying transistor Q15. The base of the transistor Q22 is connected to the collector of the transistor Q19. An output voltage VOUT is output from the output node 22 to which the collector of the transistor Q19 is connected.

On the other hand, the filter adjusting circuit 20 is constituted by a constant current source I0 connected in series between the VCC potential and the ground potential GND, an npn transistor Q0, the collector and base of which are connected to each other, and a resistor R0, an npn transistor Q1, the base of which is connected to the base of the transistor Q0, a resistor R1 connected between the emitter of the transistor Q1 and the ground potential GND, a pnp transistor Q2 which is connected between the VCC potential and the collector of the transistor Q1, and the base and emitter of which are connected to each other, a pnp transistor Q3, the base of which is connected to the base of the transistor Q2, and the emitter of which is connected to the VCC potential, a resistor R2 connected between the collector of the transistor Q3 and the ground potential GND, an npn transistor Q8, the base of which is connected to the collector of the transistor Q3, an npn transistor Q10, the emitter of which is connected to the emitter of the transistor Q8, a resistor R4 connected between a common emitter connecting point of the transistors Q8 and Q10 and the ground potential GND, a pnp transistor Q7 which is connected between the VCC potential and the collector of the transistor Q8, and the base and emitter of which are connected to each other, a pnp transistor Q9, the base of which is connected to the base of the transistor Q7, the emitter of which is connected to the VCC potential, and the collector of which is connected to the collector of the transistor Q10, an npn transistor Q12, the base of which is connected to the collector of the transistor Q9, and the emitter of which is connected to the base of the transistor Q10, a resistor R5 and a pnp transistor Q11 connected in series between the VCC potential and the collector of the transistor Q12, a pnp transistor Q13, the base of which is connected to the transistor Q11, a resistor R6 connected between the VCC potential and the emitter of the transistor Q13, an npn transistor Q14, the collector and base of which are connected to each other and a resistor R7, the npn transistor Q14 and the resistor R7 being connected in series between the collector of the transistor Q13 and the ground potential GND, and a variable resistor VR which is connected outside the integrated circuit between the base of the transistor Q10 and the external ground potential for the integrated circuit, and which has an extremely low temperature coefficient.

The transistors Q8 and Q10 constituting a differential pair form a buffer amplifier circuit. The transistors Q0 and Q1 form a current mirror circuit CM1. The transistors Q2 and Q3 form a current mirror circuit CM2. The transistors Q7 and Q9 form a current mirror circuit CM3 to be a load of the buffer amplifier circuit. The transistors Q11 and Q13 form a current mirror circuit CM4. The transistors Q11 and Q13 forming the current mirror circuit CM4 have emitter areas twice those of other transistors, respectively.

The bases of the transistors Q0 and Q14 in the filter adjusting circuit 20 are respectively connected to the bases of the transistors Q18 and Q21 in the filter circuit 21. Resistances of the resistors R2, R8 and R12 are set so as to satisfy relation R2=R8=R12. The base of the transistor Q11 in the filter adjusting circuit 20 is connected to the base of the transistor Q19 in the filter circuit 21. Resistances of the resistors R5, R6, and R10 are set so as to satisfy relation R5=R6=R10/2.

Note that, temperature coefficients of the resistors R0 to R2 and R4 to R12 in the integrated circuit are equal to each other.

In the filter adjusting circuit 20, the base potential of the transistor Q0 of the current mirror circuit CM1 receiving a current from the constant current source I0 is supplied to the base of the transistor Q18 in the filter circuit 21. A current from the constant current source I0 is supplied to the resistor R2 through the current mirror circuits CM1 and CM2, so that a potential difference appears across both terminals of the resistor R2. The voltage across the resistor R2 is supplied to both terminals of the variable resistor VR outside the integrated circuit by the buffer amplifier circuit. A current proportional to a current supplied to the variable resistor VR is supplied to the transistor Q14 and the resistor R7 through the current mirror circuit CM4. The base potential of the transistor Q14 is supplied to the base of the transistor Q21 in the filter circuit 21.

In the filter circuit 21, a potential difference proportional to the first potential difference generated across the resistor R2 in the filter adjusting circuit 20 appears across each of the resistors R8 and R12. Characteristics of the filter circuit 21 are controlled by a current supplied to the transistor Q21 receiving a base current from the filter adjusting circuit 20. A transfer function of the filter circuit 21 can be obtained by the following equation.

$$\frac{VOUT}{VIN} = \frac{1}{1 + j\omega C(R8 + R12 + 4re0)(re1/re0)} \quad (1)$$

where, $$re0 = \frac{2V_T}{IC18} \quad (2)$$

re0 is the A.C. emitter equivalent resistance of Q18,
IC18 is a collector current of the transistor Q18, $$re1 = \frac{2V_T}{IC21}$$

re1 is the A.C. emitter equivalent resistance of Q21,
IC21 is a collector current of the transistor Q21, $$V_T = \frac{KT}{q}$$

k is a Boltzmann's constant,
q is an electric charge of an electron, and
T is an absolute temperature.

In addition, a time constant T0 of the filter circuit 21 is given by:

$$\begin{aligned} T0 &= C(2 \cdot R2 + 4re0)(re1/re0) \\ &= C\left(2 \cdot R2 + 4 \frac{2V_T}{IC18}\right) \cdot \frac{2V_T}{IC21} \cdot \frac{IC18}{2V_T} \\ &= 2C\frac{R2 \cdot I0 + 4V_T}{IC21} \end{aligned} \quad (5)$$

In addition, since equation (6) can be established, equation (7) can be obtained.

$$IC21 = \frac{R2 \cdot I0}{VR} \quad (6)$$

$$T0 = 2C\frac{VR(R2 \cdot I0 + 4V_T)}{R2 \cdot I0} \quad (7)$$

Since equation (7) includes a term $V_T$, T0 changes with a change in temperature.

That is, the filter circuit 21 constitutes a low-pass filter, so that a ratio between the currents IC18 and IC21 of the filter circuit 21 is adjusted by the adjustment of the variable resistor VR connected outside the integrated circuit through the filter adjusting circuit 20, so that the current IC18 is kept constant. Therefore, by adjusting a magnitude of the current IC21, an error of the time constant T0 caused by the fluctuation of the capacitor C of the filter circuit 21 can be adjusted so that the time constant T0 can be kept to be a predetermined value at a predetermined temperature.

In the conventional filter circuit, however, the characteristics of the transistors of the filter circuit 21 are changed by the change in temperature, so that the time constant is changed.

As described above, the conventional analog filter circuit has a problem that characteristics of transistors of a filter circuit are changed by a change in temperature, so that a time constant is changed.

SUMMARY OF THE INVENTION

It is, therefore, an object of the present invention to provide an analog filter circuit capable of compensating for a time constant error caused by a fluctuation of a capacitance of the filter circuit to keep the time constant at a predetermined value at a predetermined temperature, and stabilizing the time constant of the filter circuit against a change in temperature, by adjusting a current of the filter circuit through a filter adjusting circuit by adjustment of a variable resistor.

According to the present invention, there is provided an analog filter circuit comprising a filter circuit for receiving an analog voltage, a filter adjusting circuit for adjusting a time constant in the filter circuit, and a filter compensation circuit for compensating for a time constant error in the filter circuit on the basis of a change in temperature.

In addition, according to the present invention, there is provided an analog filter circuit comprising a filter adjusting circuit having first circuit means for generating a first current, second circuit means for generating a first potential difference proportional to the first current, voltage buffer means for receiving the first potential difference, a variable resistor, both sides of which receive an output from the voltage buffer means, and third circuit means for generating a second current proportional to a current supplied to the variable resistor, a filter compensation circuit having forth circuit means for generating a second potential difference proportional to an absolute temperature and adding the second potential difference to an input of the voltage buffer means, and a filter circuit which has a capacitor and a time constant of which is adjusted in accordance with the second current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 2 is a circuit diagram showing an arrangement according to an embodiment of the present invention;

FIG. 3 is a block diagram showing a part of the circuit of the embodiment;

FIG. 4 is a circuit diagram showing an arrangement according to another embodiment of the present invention.

DETAILED DESCRIPTION OF THE PREFERRED EMBODIMENTS

The present invention will be described in detail with reference to embodiments in conjunction with the accompanying drawings hereinafter.

Figure 1:
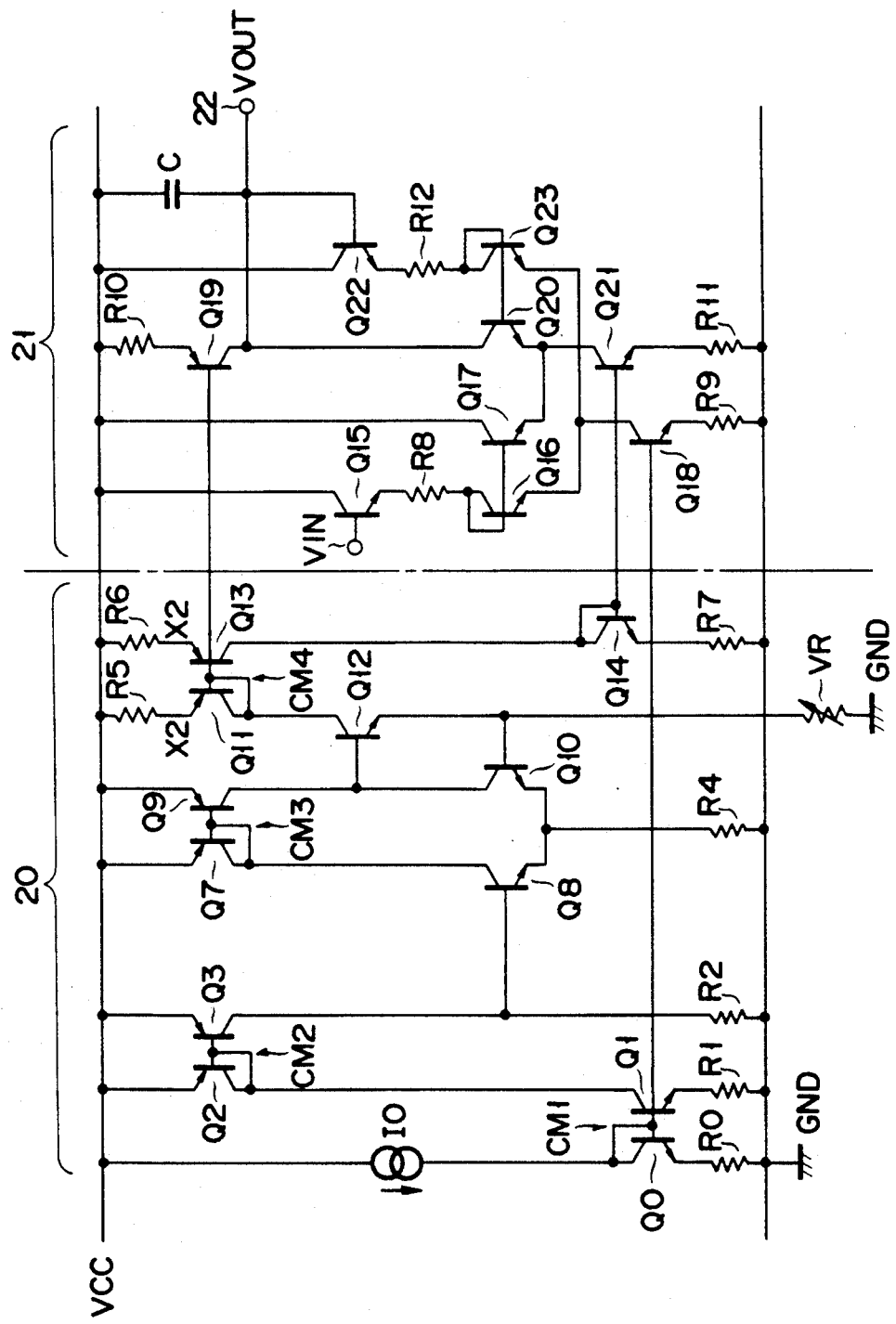
FIG. 1 is a circuit diagram showing a conventional analog filter circuit.

An analog filter circuit according to the present invention shown in FIG. 2 is different from the conventional circuit shown in FIG. 1 in comprising a filter compensation circuit 23 for generating a potential difference having temperature characteristics which cancel changes in characteristics of transistors in a filter circuit 21 caused by a change in temperature. The same reference numerals as in FIG. 1 denote the same parts in FIG. 2, and a detailed description thereof will be omitted.

More specifically, in the filter compensation circuit 23 added to the filter circuit in FIG. 2, an npn transistor Q4, the collector and base of which are connected to each other, is connected between the collector of a transistor Q3 and a resistor R2. The base of an npn transistor Q5 is connected to the base of the transistor Q4. The collector of the transistor Q5 is connected to a VCC potential. The transistors Q4 and Q5 form a current mirror circuit CM5. In this case, an emitter area of the transistor Q4 is equal to that of a transistor Q0 or the like. An emitter area of the transistor Q5 is, however, set to be $e^4$ (e: the base of a natural logarithm) times that of the transistor Q4. That is, emitter current densities of the transistors Q4 and Q5 in the current mirror circuit CM5 are set to be $e^4:1$.

A collector-emitter path of an npn transistor Q6 and a resistor R3 are connected in series between the emitter of the transistor Q5 and a ground potential GND. A base potential of the transistor Q0 is supplied to the base of the transistor Q6. The emitter of the transistor Q5 is connected to the base of a transistor Q8.

An operation of the filter circuit is essentially the same as the operation of the conventional filter circuit described with reference to FIG. 1. However, a second potential difference proportional to an absolute temperature appears between the emitters of the transistors Q5 and Q4 on the basis of a voltage difference between the base-emitter paths of the transistors Q5 and Q4 having different current densities. Assume the current flowing through resistor R2 is I0. In this case, the first potential difference generated across the resistor is R2*I0. The second potential difference generated between the emitters of transistors Q4 and Q5 is given by the difference between the base-emitter voltages $V_{BE}$ thereof. Here the base-emitter voltages $V_{BE4}$ and $V_{BE5}$, of transistors Q4 and Q5, can be expressed as:

$$V_{BE4} = V_T \ln(I_E/I_S)$$

$$V_{BE5} = V_T \ln(I_E/I_S \cdot e^4)$$

where $I_E$ is an emitter current and $I_S$ is a saturated current which is proportional to the emitter area. Since the second potential difference is defined as $V_{BE5} - V_{BE4}$, $V_{BE5} - V_{BE4} = V_T \ln(e^4/1)$. The sum of a first potential difference generated across both the terminals of the resistor R2 and the second potential difference generated between the emitters of the transistors Q5 and Q4 are supplied to a variable resistor VR through a buffer amplifier circuit. A current proportional to the current supplied to the variable resistor VR is supplied to a transistor Q14 and a resistor R7 through a current mirror circuit CM4. A base potential of the transistor Q14 is supplied to the base of a transistor Q21 in the filter circuit 21.

As a result, even if a time constant T0 of the filter circuit 21 is changed by a change in characteristics of the transistors in the filter circuit 21 caused by a change in temperature, a potential difference having temperature characteristics for canceling the change in characteristics of the transistors in the filter circuit 21 caused by the change in temperature is generated in a filter adjusting circuit 20. The potential difference is supplied to the filter circuit 21. Therefore, the time constant T0 is kept at a predetermined value against the change in temperature.

More specifically, in the filter circuit of the above embodiment, a current IC21 of the transistor Q21 in the filter circuit 21 is given by:

$$IC21 = \frac{R2 \cdot I0 + V_T \ln(e^4/1)}{VR} \qquad (8)$$

$$= \frac{R2 \cdot I0 + 4V_T}{VR}$$

Therefore, the time constant T0 of the filter circuit can be obtained by the following equation.

$$T0 = 2C \frac{R2 \cdot I0 + 4V_T}{\frac{R2 \cdot I0 + 4V_T}{VR}} \qquad (9)$$

$$= 2C \cdot VR$$

As described above, the time constant T0 of the filter circuit 21 is determined by only a capacitor C of the filter circuit 21 and a resistance of the variable resistor VR outside the integrated circuit. Therefore, the time constant T0 is kept at a predetermined value against the change in temperature.

As described above, according to the analog filter circuit of the present invention, a time constant error caused by a fluctuation of a capacitance of the filter circuit can be compensated, the time constant is kept at a predetermined value at a predetermined temperature, and the time constant of the filter circuit is kept at a predetermined value against a change in temperature by adjusting a ratio of currents in the filter circuit through a filter adjusting circuit by adjustment of the variable resistor.

As shown in FIG. 3, the filter circuit 21 in the circuit of the embodiment described above is arranged using a so-called gm amplifier 24 wherein the base of the transistor Q15, the base of the transistor Q22, and the collector of the transistor Q19 respectively serve as a non-inverting input terminal, an inverting input terminal, and an output terminal. The inverting input terminal and the output terminal of the gm amplifier 24 are short-circuited, and the output terminal is virtually grounded by a capacitor C.

In the present invention, as a filter circuit 21, various circuits having various arrangements can be used, and the filter circuit 21 is not limited to the arrangement shown in FIG. 2.

FIG. 4 shows another embodiment of a filter circuit 21. In this case, two voltage buffer circuits 25 and 26 are arranged instead of the transistors Q15 and Q22. An analog input voltage VIN is supplied to one voltage buffer circuit 25, and an output from the voltage buffer circuit 25 is supplied to one terminal of a resistor R8. A voltage VOUT at an output node 22 is supplied to the voltage buffer circuit 26, and an output from the voltage buffer circuit 26 is supplied to one terminal of a resistor R12.

When a filter circuit having such an arrangement is used, in equation (7) about a time constant T0, $4V_T$ is replaced with $2V_T$. As a result, in this embodiment, an emitter area of a transistor Q5 in a filter compensation circuit 23 is set to be $e^2$ times that of a transistor Q4 to compensate for an effect of a temperature voltage $V_T$. That is, emitter current densities of the transistors Q4 and Q5 in a current mirror circuit CM5 are set to be $e^2$:1.

Figure 5:
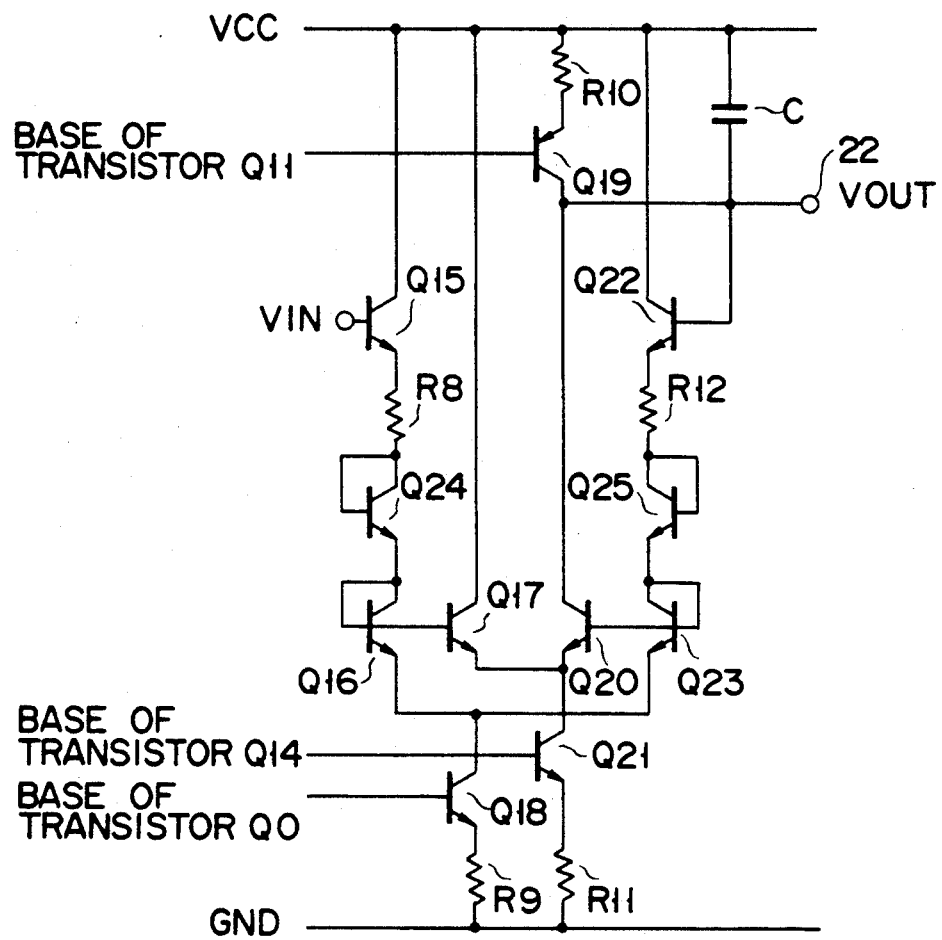
FIG. 5 is a circuit diagram showing an arrangement according to still another embodiment of the present invention.

FIG. 5 shows still another embodiment of the filter circuit 21. In this case, an npn transistor Q24, the base and collector of which are connected to each other, is connected between a transistor Q16 and a resistor R8. An npn transistor Q25, the base and collector of which are connected to each other, is further connected between a transistor Q23 and a resistor R12.

When the filter circuit having such an arrangement is used, in equation (7) about a time constant T0, $4V_T$ is replaced with $6V_T$. As a result, in this embodiment, an emitter area of a transistor Q5 in a filter compensation circuit 23 is set to be $e^6$ times that of a transistor Q4 to compensate for an effect of a temperature voltage $V_T$. That is, emitter current densities of the transistors Q4 and Q5 in a current mirror circuit CM5 are set to be $e^6$:1.

What is claimed is:

1. An analog filter circuit, comprising:
   a filter adjusting circuit including
   first circuit means for generating a first current,
   second circuit means for generating a first voltage proportional to the first current,
   a voltage buffer having an input terminal for receiving a buffer input voltage and an output terminal for outputting a buffer output voltage,
   a variable resistor coupled to said voltage buffer and having a current proportional to the buffer output voltage flowing therethrough, and
   third circuit means for generating a second current proportional to the current flowing through said variable resistor;
   a filter compensation circuit including
   fourth circuit means for generating a second voltage proportional to an absolute temperature, and
   fifth circuit means for supplying a sum of said first and second voltages to the input terminal of said voltage buffer as the buffer input voltage; and
   a filter circuit for receiving an analog voltage and said second current and outputting a filtered output voltage, a time constant of said filter circuit being adjusted in accordance with a value of said second current to maintain the time constant at a predetermined value.

2. The analog filter circuit according to claim 1, wherein said first circuit means comprises a current source circuit.

3. The analog filter circuit according to claim 1, wherein said second circuit means comprises a first resistor for generating the first voltage in accordance with the first current generated by said first circuit means.

4. The analog filter circuit according to claim 1, wherein said third circuit means comprises a current mirror circuit for outputting the second current in accordance with the current flowing through said variable resistor.

5. The analog filter circuit according to claim 1, wherein said fourth circuit means comprises first and second transistors, a ratio of emitter areas of said first and second transistors being $e^4$:1, where e is the base of the natural logarithm.

6. The analog filter circuit according to claim 1, wherein said filter circuit comprises:

an amplifier having an inverting input terminal, a non-inverting input terminal receiving said analog voltage, and an amplifier output terminal, said amplifier output terminal being connected to said inverting input terminal; and
a capacitor connected between said output terminal of said amplifier and a reference potential.

7. The analog filter circuit according to claim 6, wherein said amplifier comprises:
   a first transistor having an emitter, a base and a collector coupled to said base;
   a second transistor having an emitter coupled to the emitter of said first transistor, a base, and a collector coupled to said base;
   sixth circuit means for receiving the first current generated by said first circuit means and supplying a third current proportional to the first current to the coupled emitters of said first and second transistors;
   a third transistor having a base coupled to the base of said first transistor, a collector coupled to a power source potential, and an emitter;
   a fourth transistor having a base coupled to the base of said second transistor, an emitter coupled to the emitter of said third transistor, and a collector coupled to said amplifier output terminal;
   seventh circuit means for receiving said second current generated from said third circuit means and supplying a fourth current proportional to said second current to the coupled emitters of said third and fourth transistors;
   a second resistor having first and second terminals, the first terminal coupled to the coupled base and collector of said first transistor;
   a third resistor having a first and second terminals, the first terminal coupled to the coupled base and collector of said second transistor;
   a fifth transistor having a base coupled to receive the analog voltage, an emitter coupled to the second terminal of said second resistor, and a collector coupled to the power source potential;
   a sixth transistor having a base coupled to said amplifier output terminal, a collector coupled to the power source potential, and an emitter coupled to the second terminal of said third resistor; and
   eighth circuit means, connected between the power source potential and said amplifier output terminal, for receiving the second current generated by said third circuit means, and having a fifth current proportional to the second current flowing therethrough.

8. The analog filter circuit according to claim 7, wherein the resistances of said second and third resistors are equal.

9. The analog filter circuit according to claim 6, wherein said amplifier comprises:
   a first transistor having an emitter, a base and a collector coupled to said base;
   a second transistor having an emitter coupled to the emitter of said first transistor, a base, and a collector coupled to said base;
   sixth circuit means for receiving the first current generated by said first circuit means and supplying a third current proportional to the first current to the coupled emitters of said first and second transistors;

a third transistor having a base coupled to the base of said first transistor, a collector coupled to a power source potential, and an emitter;

a fourth transistor having a base coupled to the base of said second transistor, an emitter coupled to the emitter of said third transistor, and a collector coupled to said amplifier output terminal;

seventh circuit means for receiving said second current generated from said third circuit means and supplying a fourth current proportional to said second current to the coupled emitters of said third and fourth transistors;

a second resistor having first and second terminals, the first terminal coupled to the coupled base and collector of said first transistor;

a third resistor having a first and second terminals, the first terminal coupled to the coupled base and collector of said second transistor;

a first voltage buffer circuit having an input terminal coupled to receive the analog voltage and an output terminal coupled to the second terminal of said second resistor;

a second voltage buffer circuit having an input terminal coupled to said amplifier output terminal and an output terminal coupled to the second terminal of said third resistor; and eighth circuit means, connected between the power source potential and said amplifier output terminal, for receiving the second current generated by said third circuit means, and having a fifth current proportional to the second current flowing therethrough.

10. The analog filter circuit according to claim 6, wherein said amplifier comprises:

a first transistor having an emitter, a base and a collector coupled to said base;

a second transistor having an emitter coupled to the emitter of said first transistor, a base, and a collector coupled to said base;

sixth circuit means for receiving the first current generated by said first circuit means and supplying a third current proportional to the first current to the coupled emitters of said first and second transistors;

a third transistor having a base coupled to the base of said first transistor, a collector coupled to a power source potential, and an emitter;

a fourth transistor having a base coupled to the base of said second transistor, an emitter coupled to the emitter of said third transistor, and a collector coupled to said amplifier output terminal;

seventh circuit means for receiving said second current generated from said third circuit means and supplying a fourth current proportional to said second current to the coupled emitters of said third and fourth transistors;

a fifth transistor having an emitter coupled to the coupled base and collector of said first transistor, a base, and a collector coupled to the base;

a sixth transistor having an emitter coupled to the coupled base and collector of said second transistor, a base, and a collector coupled to the base;

a second resistor having first and second terminals, the first terminal coupled to the coupled base and collector of said fifth transistor;

a third resistor having a first and second terminals, the first terminal coupled to the coupled base and collector of said sixth transistor;

a seventh transistor having a base coupled to receive the analog voltage, an emitter coupled to the second terminal of said second resistor, and a collector coupled to the power source potential;

an eighth transistor having a base coupled to said amplifier output terminal, a collector coupled to the power source potential, and an emitter coupled to the second terminal of said third resistor; and eighth circuit means, connected between the power source potential and said amplifier output terminal, for receiving the second current generated by said third circuit means, and having a fifth current proportional to the second current flowing therethrough.

11. An analog filter circuit, comprising:

a filter circuit for receiving an analog voltage and outputting a filtered output voltage;

a filter compensation circuit for generating a temperature compensation signal proportional to an absolute temperature;

a filter adjusting circuit responsive to the temperature compensation signal and changes in a capacitance of said filter circuit for generating a filter adjusting signal for adjusting a time constant of said filter circuit to maintain the time constant at a predetermined value as temperature changes.

* * * * *